(12) United States Patent
Martin et al.

(10) Patent No.: US 8,357,259 B2
(45) Date of Patent: Jan. 22, 2013

(54) METHOD FOR ASSEMBLING AT LEAST TWO PLATES AND USE OF THE METHOD FOR PREPARING AN ION BEAM SPUTTERING ASSEMBLY

(75) Inventors: Michel Martin, Septeme (FR); Philippe Maurin-Perrier, Saint Marcellin en Forez (FR); Christophe Heau, Saint-Etienne (FR); Olivier Blandenet, Meylan (FR)

(73) Assignee: H.E.F., Andrezieux Boutheon (FR)

( * ) Notice: Subject to any disclaimer, the term of this patent is extended or adjusted under 35 U.S.C. 154(b) by 511 days.

(21) Appl. No.: 12/529,581

(22) PCT Filed: Mar. 3, 2008

(86) PCT No.: PCT/FR2008/050358
§ 371 (c)(1),
(2), (4) Date: Sep. 2, 2009

(87) PCT Pub. No.: WO2008/122738
PCT Pub. Date: Oct. 16, 2008

(65) Prior Publication Data
US 2010/0078321 A1    Apr. 1, 2010

(30) Foreign Application Priority Data
Mar. 5, 2007   (FR) ...................... 07 53648

(51) Int. Cl.
| | | |
|---|---|---|
| *B32B 7/14* | (2006.01) | |
| *B32B 37/00* | (2006.01) | |
| *B29C 65/00* | (2006.01) | |
| *B29C 65/48* | (2006.01) | |
| *C23C 14/00* | (2006.01) | |
| *C25B 11/00* | (2006.01) | |
| *C25B 13/00* | (2006.01) | |

(52) U.S. Cl. .................... 156/295; 156/291; 204/298.12
(58) Field of Classification Search .................... 156/60, 156/90, 150, 272.2, 272.6, 272.7, 277, 290, 156/291, 295, 306.6, 306.9, 325, 326, 327, 156/329; 204/298.02, 298.04, 298.12, 298.15; 438/706, 707, 710; 118/723 R, 723 VE, 118/723 CB, 723 FI
See application file for complete search history.

(56) References Cited

U.S. PATENT DOCUMENTS

| | | | |
|---|---|---|---|
| 6,613,185 B1 * | 9/2003 | Valade et al. .................. | 156/329 |
| 6,726,536 B1 * | 4/2004 | Drake et al. .................... | 451/39 |
| 2006/0070876 A1 | 4/2006 | Wu et al. | |
| 2008/0000770 A1 * | 1/2008 | White ...................... | 204/298.12 |

OTHER PUBLICATIONS

International Search Report for PCT/FR2008/050358 published Nov. 27, 2008 as WO 2008/122738 A3.

* cited by examiner

*Primary Examiner* — Philip Tucker
*Assistant Examiner* — Brian R Slawski
(74) *Attorney, Agent, or Firm* — Heslin Rothenberg Farley & Mesiti P.C.

(57) ABSTRACT

According to the method, drops of an adhesive material are deposited on one of the plates, with the drops being spaced from one another. A grid having a predefined thickness lower than that of the drops is applied to the plate receiving the drops. A perpendicular and uniform pressure is applied to at least one of the plates, so that the drops spread and come into contact with the opposing sides of the two plates. The spacing of the drops is defined so that after spreading under the pressure applied, air is not trapped between the drops.

10 Claims, 2 Drawing Sheets

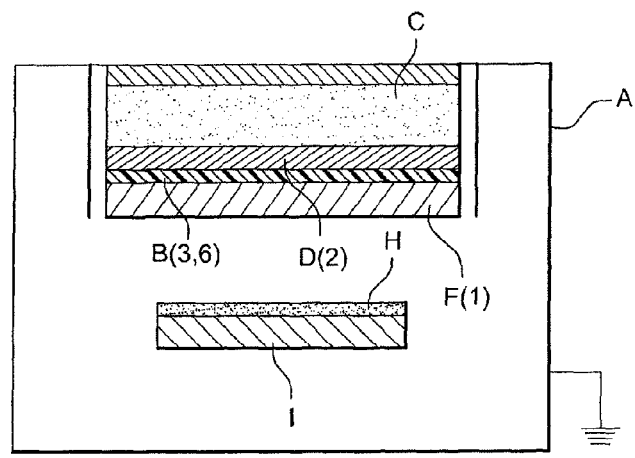
Fig. 1
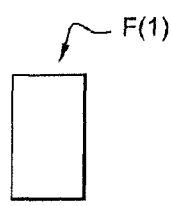 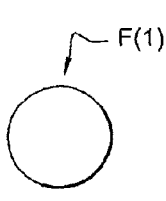 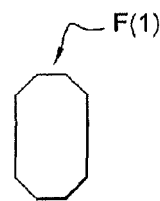 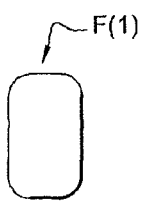 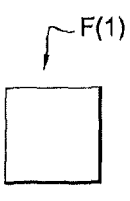
Fig. 2  Fig. 3  Fig. 4  Fig. 5  Fig. 6
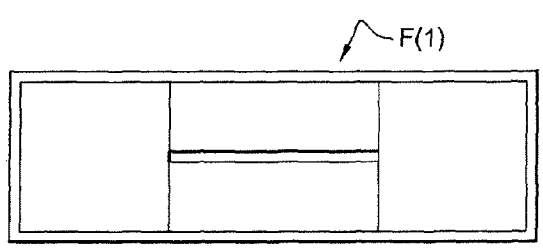 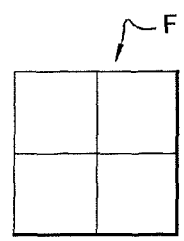
Fig. 7  Fig. 8

METHOD FOR ASSEMBLING AT LEAST TWO PLATES AND USE OF THE METHOD FOR PREPARING AN ION BEAM SPUTTERING ASSEMBLY

CROSS REFERENCE TO RELATED APPLICATIONS

This application is a national stage filing under section 371 of International Application No. PCT/FR2008/050358 filed on Mar. 3, 2008, and published in French on Oct. 16, 2008 as WO 2008/122738 and claims priority of French application No. 0753648 filed on Mar. 5, 2007, the entire disclosure of these applications being hereby incorporated herein by reference.

BACKGROUND ART

The invention relates to the technical field of the assembly of ion beam sputtering targets on a support plate.

More generally, the invention may be applied to any type of assembly between two plates having a precise spacing. This requirement to prepare an assembly between two plates, having a precise spacing, is particularly important for the sputtering targets used in all fields of application of thin films deposited under vacuum (micro-electronics, mechanical engineering, automotive, optics, flat screen, packing film, etc.).

It may be recalled, in a manner perfectly known per se to a person skilled in the art, that a physical vapour deposition takes place in a chamber at reduced pressure, with a plasma between a positive pole and a negative pole, in combination with a gas (for example argon), using either direct current, pulsed current, or high frequency current.

Reference can be made to FIG. 1, which schematically shows the main elements of a physical vapour deposition chamber.

In this example of ion beam sputtering, the positive pole consists of the walls of the chamber (A), while the negative pole consists of a sputtering target (F) which is the focus of ion bombardment. The atoms of the target (F) condense on a substrate (I) to form a thin film deposit (H). The target (F) is fixed to a support plate (D) generally associated with a cooling element (C).

The target (F) is fixed to the support plate (D) by a bonding or seal system (B).

This bond between the sputtering target and the support plate must be provided to meet certain requirements, in particular the ability to withstand a temperature of heat conduction, electrical conduction, vacuum degassing, contamination of the target, etc.

Various technical solutions have been proposed to prepare the assembly and the bond between the sputtering target and the support plate. For example, a continuous layer of solder can be used, formed between the target and the support plate.

According to the teaching of document US 2006/0266643, the bond is prepared using a thin film consisting of glue, in combination with a grid. According to document US 20060283703, the glue layer is formed of lines whereof the geometry is not indicated (width, height, length), or of parallel lines, or of network forming lines, or of lines forming concentric rings.

These various methods serve to obtain satisfactory results, but are difficult to implement. In particular, major difficulties arise for adjusting the thickness of the glue layer, for example as it appears from document WO 2006/132916. Furthermore, the glues used must provide certain specific characteristics, generally at high cost. Difficulties may also appear according to the shape and dimensions of the target used.

As it appears from document WO 2006/132916, the trapping of gas, in a layer of glue, can cause a deterioration of the solidity of the seals when placed under vacuum, by the formation of bubbles associated with the decrease in external pressure and trapped in the seal.

It is the object of the invention to remedy these drawbacks simply, safely, effectively and efficiently.

BRIEF SUMMARY OF INVENTION

The problem that the invention proposes to solve is to be able to prepare an assembly of any shape of plane target (in segments or not, with large or small dimensions) on its support, with the aim of obtaining very high uniformity of the thickness of the fastening zone, in particular to obtain a uniform heat conduction and a good ability to withstand thermal shocks.

To solve such a problem, a method for assembling of these two plates has been designed and developed, whereby:
- drops of an adhesive material are deposited on one of the plates, spaced from one another;
- a grid having a predefined thickness lower than that of the drops is applied to the plate receiving the drops;
- a perpendicular and uniform pressure is applied to at least one of the plates, so that the drops spread and come into contact with the opposing sides of the two plates;
- the spacing of the drops is defined so that after spreading under the pressure applied, air is not trapped between the said drops.

As stated above, the invention has a particularly advantageous application in the field of thin films deposited under vacuum, in such a way that one of the plates constitutes the sputtering target, while the other plate constitutes the support of the said target.

To solve the problem of obtaining a constant and accurate thickness of the seal provided by the film of adhesive material, the grid defines openings of any geometric shape having an area lower than that of the drops. The open fraction of the grid is between 20 and 50%.

According to another feature, the adhesive material is a glue. The glue is selected to polymerise in contact with moist air and ambient temperature. The glue is a silicone elastomer of the acetoxy type.

BRIEF DESCRIPTION OF DRAWING FIGURES

The invention is described in greater detail below in conjunction with the figures of the appended drawings in which:

FIG. 1 shows a schematic view of the main elements of a physical vapour deposition chamber;

FIGS. 2, 3, 4, 5, 6, 7 and 8 show various indicative and non-limiting exemplary embodiments of plane targets, which can be used according to the features of the invention;

DETAILED DESCRIPTION

Figure 9:
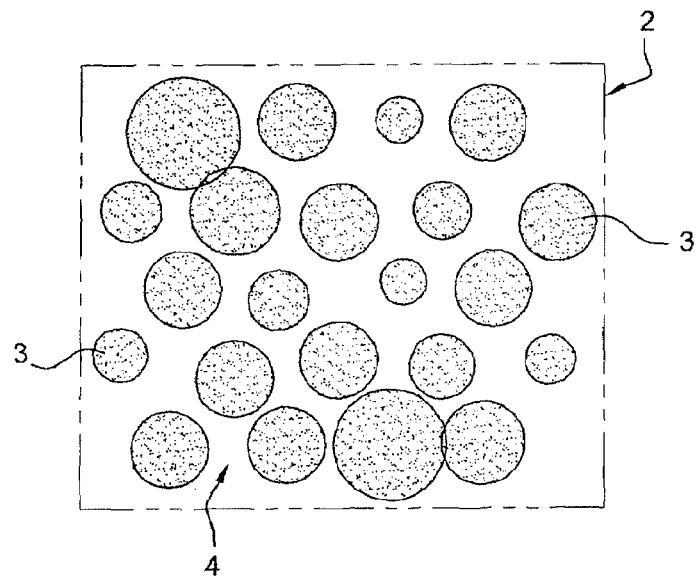
FIG. 9 is an example of a partial and plan view showing one of the plates with a network of glue drops.
Figure 10:
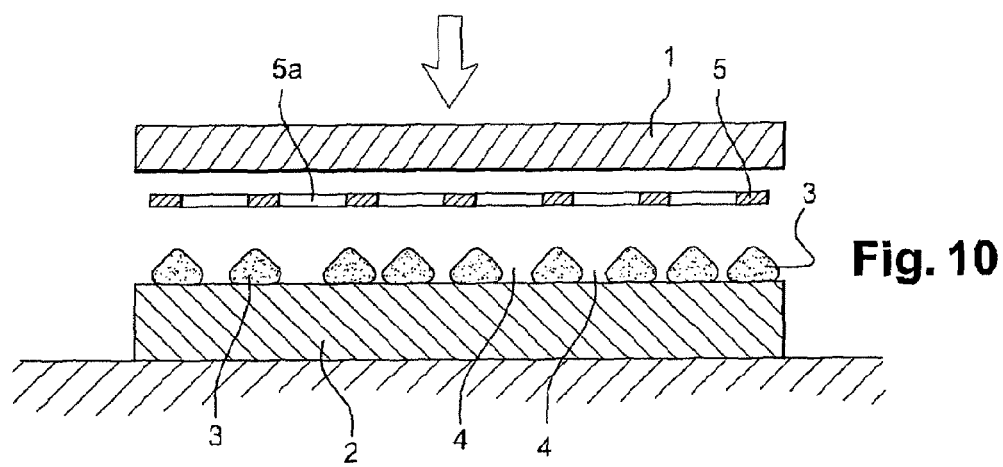
FIG. 10 shows a schematic cross section before assembly of the sputtering target on the support plate according to the features of the invention.
Figure 11:
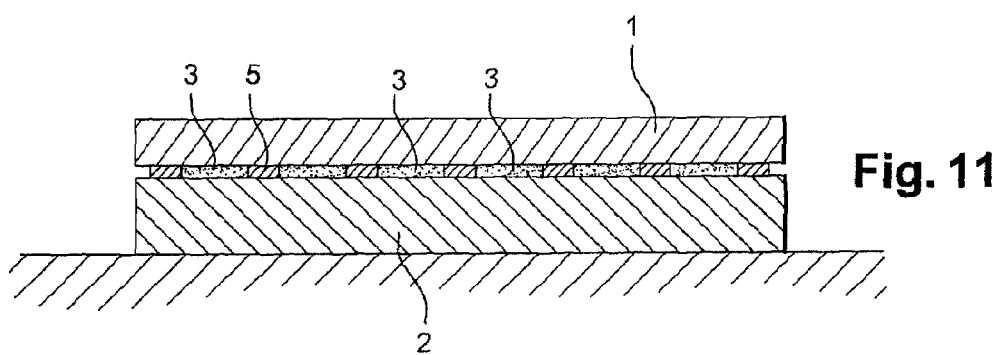
FIG. 11 shows a view corresponding to FIG. 10 after pressing the two plates corresponding to the assembly of the target on the support plate.

The description that follows applies to the fastening of two plates (1) and (2) whereof one (1) constitutes a sputtering target, while the other (2) constitutes a support plate.

This example must not be considered as limiting.

According to the invention, drops (3) of an adhesive material are placed on one of the sides of the plate (1) or of the plate (2). These drops (3) are placed in such a way as to form a network with spacings (4) between each drop. On the side of the plate (2) with the drops (3), a grid (5) is applied, having a predefined thickness (E) that is lower than the height (H) of the drops of (3). When a pressure is applied perpendicularly and uniformly to at least one of the plates, the adhesive drops (3) spread and come into contact with the opposing sides (1*a*) and (2*a*) of the two plates (1) and (2).

According to the invention and very importantly, the spacing of the drops (3) is defined so that after spreading under the pressure applied, air is not trapped between the said drops (3).

In other words, one of the key points of the invention consists in adjusting the volume and spacing of the network of adhesive drops (3), in such a way as they do not percolate after crushing.

The drops (3) of adhesive material may have a substantially circular shape or have other geometric shapes (square, rectangular, etc.).

This open network of drops of adhesive material (3) provides the degassing function. It should be observed that contact points between two adjacent drops may be acceptable insofar as the zones not covered by adhesive material are not closed by a continuous line of the said adhesive material.

The dimensional characteristics of the drops (3) of adhesive material and their spacing, according to the characteristics of the grid (3) used, may be established as follows:

Assuming that the drops (3), before pressing the two plates (1) and (2), have a shape substantially corresponding to that of a cone, having a height (h) substantially equal to its radius (R), the volume (Vc) of the drop can be determined by the following formula:

$$Vc = 1/3(\pi R^2 h) \approx 1/3(\pi R^3),$$

$$\text{hence } h \approx R \approx \sqrt[3]{\frac{3Vc}{\pi}}$$

As stated above, the height of the drop (3) of adhesive material must be greater than the thickness (E) of the grid (5) to spread when the pressure is applied to the two plates (1) and (2). The height of the drop is approximately five times greater than the thickness of the grid.

After the positioning of the two plates (1) and (2), each drop of adhesive material (3), having a volume (Vc), spreads substantially in the form of a disc having a diameter (D) as a function of the thickness (E) of the grid (5) and of its porosity according to the formula:

$$D = 2\sqrt{\frac{Vc}{\pi EP}}$$

For example, a 65 μm diameter wire grid woven to provide a grid having a total thickness (E) of 130 μm and an open fraction of 40% will have a porosity (P) close to 0.7 (70%).

If we consider a drop of glue of 10 mm³, their initial height is substantially 1.4 mm according the above approximation. With such a grid, the diameter (D) of the final disc of glue is:

$$D = 2\sqrt{\frac{Vc}{\pi EP}} = 2\sqrt{\frac{10}{\pi \times 0.13 \times 0.7}} = 11.8 \text{ mm}$$

In the case of a square or zigzag grid with a uniform drop spacing, the distance between these drops (the pitch) must be higher than the final diameter of the drops of glue, that is, in the example, higher than 11.8 mm. A spacing of 2 to 3 mm is necessary between the drops ultimately to avoid contact points between the drops, that is, in the present case, Pitch=11.8+(2 or 3)=14 to 15 mm approximately.

In general, the grid (5) defines openings (5*a*) having any geometric shape, and an area lower than that of the drops. This open fraction of the grid (5) is between 20 and 50%, for example 30 or 40%.

Advantageously, the adhesive material constituting the drops (3) is a glue.

No restriction is indicated on the type of glue that can be employed with this method. For each application, it is necessary to define the compatibilities and bonding efficiencies, both on the support plate and on the target. The choice of the glue takes account of the requirement to withstand temperature, heat conduction, electrical conduction, vacuum degassing, contamination of the target.

If necessary, a treatment or a surface coating can be provided both on the target side and on the side of the plate to be assembled in order to improve the adhesion of the glue, so as to limit the diffusion of the glue, or of one of its components, in the target. The fact that the network of drops (3) of glue does not percolate also makes it possible to use glues or glue putties of the acetoxy type which polymerize in air thanks to the presence of moisture. Other types of glue requiring the presence of a gas or causing the removal of a reaction residue, may be employed with this assembly method.

In view of the basic features of the invention, the assembly method can be applied to any target shape, as it appears from the indicative examples, which are non-limiting, of FIGS. 2 to 8.

EXAMPLE NO. 1

In order to prepare thin film deposits of electrolytes of the LiPON type, a high frequency ceramic magnetron cathode sputtering target of the $Li_3PO_4$ type is taken, consisting of 4 plates 5 mm thick and wherein two plates (segments) have the dimensions 130×140 mm and two plates have the dimension 180×65 mm, which are assembled on a copper support plate having the dimensions 450×150×6 mm, as shown in FIG. 7, leaving an opening of 10×180 mm at the centre and, on the periphery, a border 5 mm wide. The spacing between the plates is adjusted to 0.3 mm.

A copper grid having an open fraction of 40% and porosity of 0.7, consisting of 65 μm copper wires (that is total thickness of the grid: about 130 μm), is placed on the overall surface of the support plate. A network of glue drops is then deposited, in a square network having a volume of between 10 and 20 mm³ and a spacing of 16 to 21 mm in the two directions of the square network.

The various target segments are then positioned (FIG. 7) on the grid and the drops of glue. The assembly is pressed between two parallel plates with a force of 2000 N applied perpendicularly to the plates for 48 hours in air at 20° C. and 40% RH.

This produces a sputtering target which can be sputtered with a power of 1.5 kW under 0.8 Pa of pure nitrogen. A network of cracks is observed to be formed in the ceramic plates constituting the target, and perpendicular to the ceramic plates. These cracks are due to the temperature difference between the two sides of the ceramic during the sputtering (hot on the plasma side and cold on the cooler side). It is observed that the working pressure during the sputtering remains stable at about 0.8 Pa and that the electrical sputtering parameters are very stable. The thin films obtained have excellent reproducibility and quality with this assembly. The network of cracks is observed to remain stable and not cause any additional degradation of the target. All the results attest to the quality of the assembly.

EXAMPLE NO. 2

A mixed indium tin oxide (ITO) sputtering target is used, having a length of 2 m and a width of 1 m, comprising plates measuring 500×200×5 mm. A support plate, in a single piece, made from stainless steel and measuring 2×1 m and with a thickness of 5 mm, is available. This support plate is abraded with grade 200 abrasive paper in order to create a roughness that promotes the adhesion of a glue. It is then cleaned of dust by a powerful jet of filtered air. The support plate is positioned flat and horizontal. A network of isosceles triangles of drops of glue containing aluminium powder is deposited on the plate, the volume of each drop being between 20 and 50 mm$^3$, and the drops being spaced from one another with a spacing of 20 to 30 mm. A copper grid having a total thickness of 0.2 mm, wire diameter 0.1 mm, open fraction 30% and porosity 0.65 is then applied. The ITO plates are then deposited on the grid and the drops of glue with a maximum spacing of 0.3 mm between the ITO plates. The assembly is introduced into a bag in which vacuum is created up to 1 mbar. The bag is then hermetically sealed. The assembly is then introduced into a pressurization chamber which is closed and the pressure increased to 4 bar. The whole is maintained for 48 h at ambient temperature. The sputtering target is removed from the chamber and then from the bag. It is mounted on the cooler of the cathode and the assembly is then placed under vacuum.

After a power ramp up during which moderate degassing is observed, the target reaches the nominal power of 1.5 watt/cm$^2$. The performance of the ITO thin films prepared with this target is measured, as well as the temperature reached by the substrates. All the performance characteristics are compatible with those generally obtained, both in terms of uniformity and in terms of quality.

It should be observed that any type of grid (5) can be used provided that the glue or other adhesive material can pass from one part to the other of the grid, during the assembly operation corresponding to the application of pressure on the two plates. For applications in which the target is sputtered by a magnetron process, the grid is prepared from a non-ferromagnetic material (copper, aluminium, etc.). It is also possible to use ferromagnetic materials designed, for example, to make the magnetic field lines pass through, or if such a material does not have any drawback.

The advantages clearly appear from the description, and the following in particular can be emphasized and recalled:
- the network of drops of glue or other adhesive material, provides excellent uniformity in the assembly, regardless of the shape of the target, thereby avoiding the directional characteristics, as opposed to a layer of glue applied in the form of parallel lines;
- the possibility of separating the assembly (target/support) more easily due to the porosity of the said assembly, whereof all the points are relatively accessible to any fluid which can attack the said assembly and, in consequence, making it easier to re-use the support plates after the target is used;
- the possibility of using polymer glues of the acetoxy type (example 1) which polymerize due to the moisture in the air, such glues being inexpensive, being able to withstand at least 230° C., while demonstrating good elasticity.

The invention claimed is:

1. Method for assembling at least two plates, wherein:
   drops of an adhesive material are deposited on one of the plates, the drops being spaced from one another so that zones not covered by adhesive material are not closed by a continuous line of said adhesive material;
   a grid having a predefined thickness lower than a thickness of the drops is applied to the plate receiving the drops;
   a perpendicular and uniform pressure is applied to at least one of the plates, so that the drops spread and come into contact with opposing sides of the two plates; and
   the spacing of the drops is defined so that after spreading under the pressure applied an open network of zones not covered by adhesive material remains between the drops, whereby air is not trapped between said drops.

2. Method according to claim 1, wherein the grid defines openings of any geometric shape having an area lower than an area of the drops.

3. Method according to claim 1, an open fraction of the grid is between 20 and 50%.

4. Method according to claim 1, wherein the adhesive material comprises a glue.

5. Method according to claim 4, wherein the glue is selected to polymerize in contact with moist air at ambient temperature.

6. Method according to claim 1, wherein the glue comprises a silicone elastomer of acetoxy type.

7. The method according to claim 1, employed for preparing an ion beam sputtering target, wherein one of the plates constitutes the target, while the other plate constitutes a support of the target, and the support and the target are assembled by the spaced drops in combination with the grid.

8. Vacuum ion beam sputtering assembly comprising a target and a support, wherein the target is fixed to the support via drops of an adhesive material spaced apart so that zones not covered by adhesive material are not closed by a continuous line of the adhesive material, and after spreading by applied pressure an open network of zones not covered by the adhesive material remains between drops, whereby air is not trapped between the drops, in combination with a spacer grid of predefined thickness lower than a thickness of the drops.

9. The method according to claim 1, wherein the drops have a substantially circular shape.

10. The method according to claim 9, wherein pitch of the drops as deposited is higher than a final diameter of the drops after spreading under the pressure applied.

* * * * *